Jan. 10, 1967 B. W. STEPHENSON 3,298,014
ANALOG TO DIGITAL CONVERTER
Filed Nov. 1, 1963 2 Sheets-Sheet 1

INVENTOR.
BARBERA W. STEPHENSON
BY
Blair E. Buckles
ATTORNEYS

Jan. 10, 1967 B. W. STEPHENSON 3,298,014

ANALOG TO DIGITAL CONVERTER

Filed Nov. 1, 1963 2 Sheets-Sheet 2

INVENTOR.
BARBERA W. STEPHENSON
BY
*Blair & Buckles*
ATTORNEYS

United States Patent Office 3,298,014

Patented Jan. 10, 1967

3,298,014

ANALOG TO DIGITAL CONVERTER

Barbera W. Stephenson, Belmont, Mass., assignor to Digital Equipment Corporation, Maynard, Mass.

Filed Nov. 1, 1963, Ser. No. 320,710

12 Claims. (Cl. 340—347)

Figure 1:
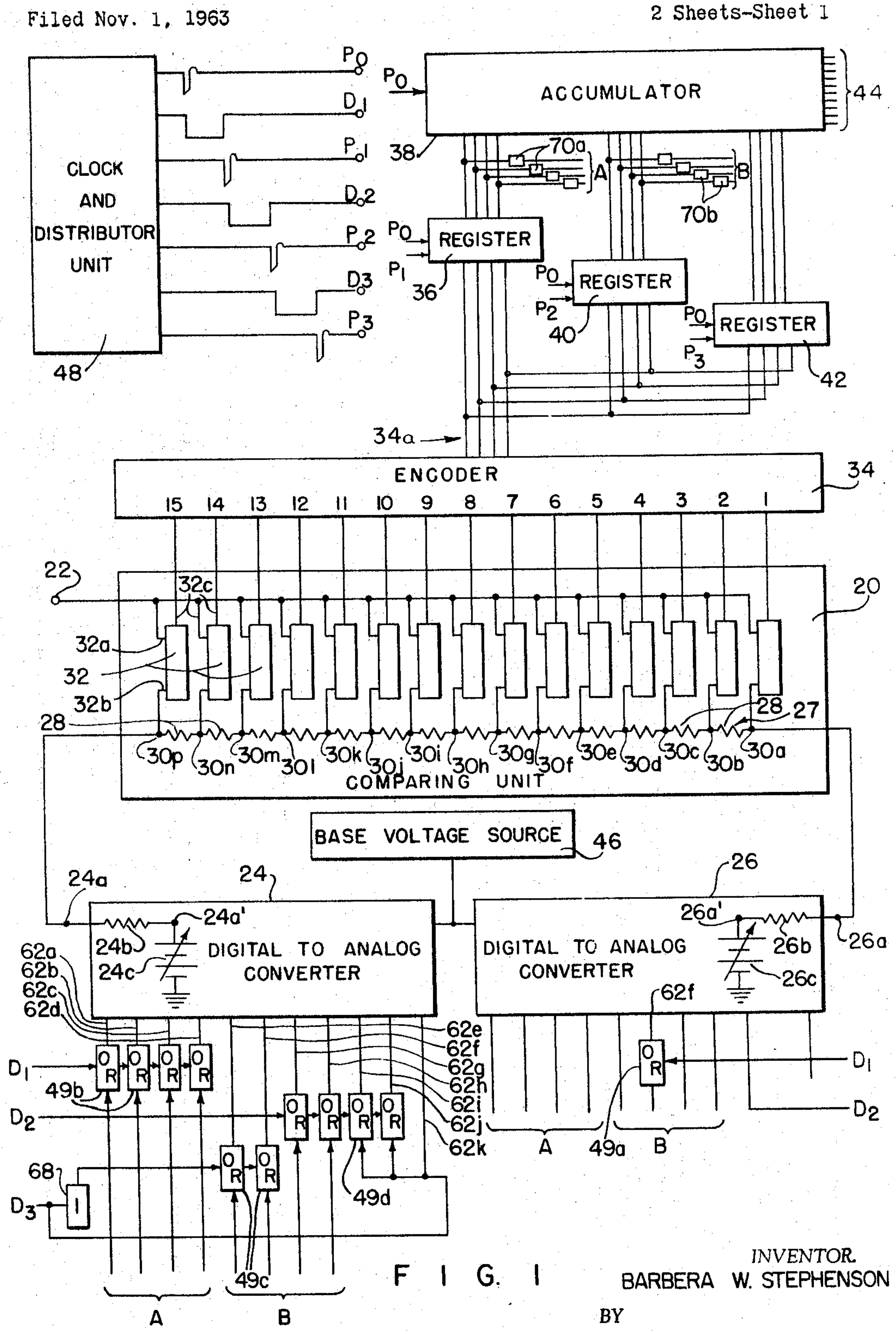

This invention relates to a method and apparatus for converting an analog quantity to a corresponding digital representation. The invention makes possible high speed conversion with reliable accuracy at relatively low cost, even for operation with large numbers of digits.

More specifically, the invention relates to data processing equipment for producing a number equal to the amplitude of a voltage. The equipment, termed an analog to digital converter, successively compares an input voltage with several ordered series of reference voltages. The span or range of the reference voltages is decreased between comparisons so that each comparison provides an increasingly accurate digital representation of the value of the input voltage. The converter operates with a novel logic sequence whereby the result of each comparison automatically corrects errors of one count in the number determined with the preceding comparison. That is, the amount of the error corrected in this manner is one least significant digit.

In an illustrative application of an analog to digital converter, a digital computer processing pressure data, derived from a pressure transducer, may require such a converter to transform the transducer's pressure-responsive output voltage to digital notation.

According to the known parallel technique for analog to digital conversion, a converter simultaneously compares the input voltage with an ordered series of reference voltages. The converter codes the value of the highest reference voltage exceeded by the input voltage to develop its digital counterpart. Such converters require a separate comparator for each reference voltage, so that the number of comparators increases according to the resolution with which the input voltage is to be converted to digital notation. Thus, a parallel converter determining the value of the input voltage with N binary digits requires $2^N$ comparators. Accordingly, high resolution parallel converters, although they require only one comparing step, are uneconomical due to the high cost of the many comparators. The requirement that the comparators have essentially identical characteristics further increases the cost of parallel analog to digital converters.

Another prior analog to digital converter compares the input voltage with a single reference voltage that successively increases one level at a time. The position of the counter, or other device producing the reference voltage, at the highest level thereof exceeded by the input voltage is noted and converted to digital notation. Since only one comparison is made at a time, such successive operating converters require only a single comparator but require $2^N$ comparing steps. Thus, they require a relatively long time to complete each conversion and hence are unsatisfactory where high speed is required.

In a prior art successive approximation converter, a single comparator first determines in which half of a selected range the input voltage lies. The result of this comparison is used to change the comparator's reference voltage to enable it to identify which quarter of the range contains the input voltage. Each succeeding comparison step further divides by two the portion of the range identified in the preceding comparison according to the value of the input voltage. With this technique, conversion to N digits requires N+1 successive steps with the single comparator.

Accordingly, it is an object of the present invention to provide a method and apparatus for effecting improved analog to digital conversion.

More particularly, the invention has an object the provision of an efficient and economical method and apparatus for analog to digital conversion. Thus, it is an object to provide an analog to digital converter that completes each conversion with relatively few steps to achieve rapid operation and yet requires a relatively low number of comparators and other logic circuits.

Another object of the invention is to provide a conversion method and apparatus of the above character for operation with a large number of digits, i.e., capable of high resolution.

A further object of the invention is to provide an analog to digital method and apparatus characterized by reliability and accuracy.

The invention accordingly comprises the several steps and the relation of one or more of such steps with respect to each of the others and the apparatus embodying features of construction, combinations of elements and arrangement of parts which are adapted to effect such steps, all as exemplified in the following detailed disclosure, and the scope of the invention will be indicated in the claims.

Figure 2:
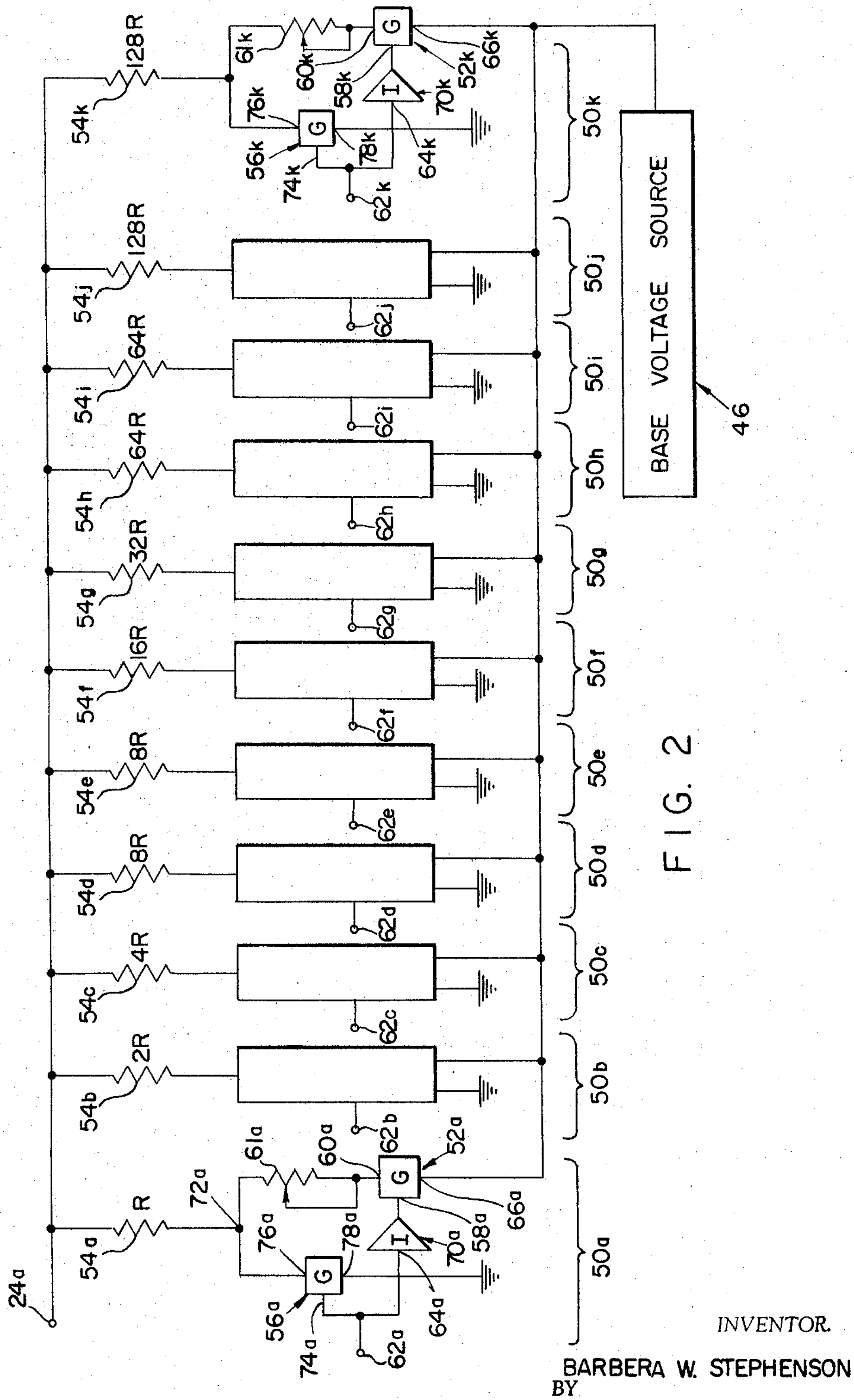

For a fuller understanding of the nature and objects of the invention, reference should be had to the following detailed description taken in connection with the accompanying drawings, in which:

FIG. 1 is a schematic diagram, in block form, of an analog to digital converter embodying the invention; and FIG. 2 is a schematic representation of a digital to analog converter used in the converter of FIG. 1.

*General description*

The analog to digital converter of the present invention converts an analog quantity to its digital representation in a sequence of increasingly accurate parallel, i.e. simultaneous, comparisons. In general, it comprises a comparing unit that compares the input voltage with an ordered series of reference voltages. An encoder connected with the comparing unit develops a first set of digits identifying the number of reference voltages that the input voltage exceeds in a selected direction. In essence, the encoder thus identifies the two adjacent reference voltages that bracket the input voltage. Moreover, these first digits are the most significant digits of the digital representation of the input voltage.

The reference voltages are then reset to cover with greater resolution the voltage range between the two adjacent reference voltages that the encoder identifies. Thereafter, the converter compares the input voltage with the new reference voltages to produce the next most significant digits of number identifying the input voltage.

More specifically, a pair of digital to analog converters that supplies the reference voltages receives the first set of digits from the encoder and in response thereto change the reference voltages in the comparing unit. The digital to analog converters decrease the range of the reference voltages so that for each comparison the increment between adjacent reference voltages corresponds to the least significant digit determined with that comparison. Additional comparisons are made in this manner until the desired resolution is attained.

This sequence of parallel comparisons achieves rapid conversion of the input analog quantity, i.e. voltage, to the corresponding digital representation with a minimum of equipment.

Another feature of the present converter is the ability to correct errors. For this purpose, the most significant digit determined in each comparison has the same weight as the least significant digit determined in the preceding comparison. The converter automatically combines the two same-significance digits as set forth below to produce the correct result. This feature decreases the converter's operating time, in addition to providing other advantages described hereinafter.

The embodiment of the invention described below utilizes the binary number system, in which the base or radix is 2. Accordingly, the illustrated converter develops a binary number equal to the value of the input voltage.

*The analog to digital converter—FIG. 1*

FIG. 1 shows a block diagram of an analog to binary converter embodying the invention. A comparing unit indicated generally at 20 receives at its input terminal 22 the input voltage that is to be converted to digital notation and performs the parallel comparisons discussed above. Two digital to analog converters indicated at 24 and 26 apply a selected voltage across a multiple-tapped voltage divider 27 comprising a succession of series-connected resistors 28. The selected voltage produces a series of reference voltages at nodes 30 between adjacent resistors 28 and between the end resistors 28 and the digital to analog converters 24 and 26. The smallest or initial reference voltage in each series develops at the terminal 30*a* and the largest final voltage develops at the terminal 30*p*. The resistors 28 preferably have the same resistance so that the reference voltages at adjacent nodes differ by a uniform increment.

In the illustrated embodiment, the comparing unit 20 has fourteen resistors 28 so that there are fifteen nodes 30*a*, 30*b* . . . 30*m*, 30*p*. Thus, for example, if the digital to analog converter 26 applied a one-half volt level to its output terminal 26*a*, and the converter 24 applied 16½ volts to its output terminal 24*a*, the sixteen series connected resistors (fourteen resistors 28 plus the internal resistances 24*b* and 26*b* of the converters 24 and 26) divide the 16-volt difference into one-volt increments between the reference voltages at adjacent nodes 30.

The comparing unit 20 also has a plurality of comparators 32, each having a pair of input terminals 32*a* and 32*b* and an output terminal 32*c*. The comparator input terminals 32*a* are connected to the input terminal 22 to receive the input voltage. The input terminal 32*b* of each comparator is connected to one of the nodes 30. The output signal from each comparator 32 is at a first level when the voltage at the terminal 22 exceeds the reference voltage at the node 30 to which the comparator is connected. Conversely, when the reference voltage at the node associated with a comparator exceeds the input voltage, the comparator's output signal is at a second level.

As also shown in FIG. 1, an encoder indicated generally at 34 has fifteen input terminals designated 1, 2, 3 . . . 15 and a group of four output terminals 34*a*. The encoder 34 receives at its input terminals the comparator output signals from the comparing unit 20 and develops a binary signal identifying the number of comparators 32 having a first level output signal, i.e., the number of comparators connected to nodes 30 whose voltages are less than the input voltage. The encoder thus identifies in binary notation the highest reference voltage exceeded by the input voltage, or put another way, it identifies the two reference voltages bracketing the input voltage.

As discussed above, the system successively compares the input voltage with different sets of reference voltages. More specifically, the increment between adjacent reference voltages is decreased for successive comparisons to correspondingly increase the resolution with which the input voltage is converted to binary form.

With reference to the illustrated embodiment, from the first comparison, the encoder 34 develops at its terminal 34*a* the four most significant binary digits representing the input voltage. The encoder 34 delivers these four digits to a register 36 that also transfers them to an accumulator 38.

The second comparison can then be made by applying to the ends of the voltage divider 27 the two voltages bracketing the input voltage in the first comparison. That is, the particular one-volt increment in which the input voltage lies may be spread over the entire divider so that the second comparison will determine, again with a resolution of four binary places, the location of the input voltage within this increment. However, for error correcting purposes, as detailed below, it has been found preferable to expand two initial increments, instead of one, over the voltage divider 27. In essence, this reduces the resolution of the second comparison by one binary digit, i.e., to three digits.

In response to the second comparison, the encoder 34 produces again four binary digits at its terminals 34*a*. It delivers these digits to a register 40 also connected to transfer them to the accumulator 38. However, with the preferred mode of operation, the most significant of these four digits has the same weight as the least significant digit resulting from the first comparison and can therefore be used to correct any error in that digit present in the recorded result of the first comparison. Thus, after the second comparison, the illustrated converter has identified the seven most significant digits of the desired binary number.

Following a third comparison, the encoder 34 develops a third set of four binary digits. These are fed to a register 42 for ultimate transfer to the accumulator 38. Again for correction purposes, the most significant of the third set of four digits has the same weight as the least significant digit in the second set. The three remaining digits in the third set identify the eighth, ninth and tenth digits of the output number.

The accumulator 38 sums the twelve binary digits it receives from the encoder 34 and, in so doing, it makes any corrections necessary to provide a 10-digit representation of the input voltage. The output of the analog to digital converter is taken from the output terminals 44 of the accumulator 38. Preferably, for each comparison, the voltages applied to the ends of the divider 27 are so related to the number of nodes 30 that the voltage increment between adjacent nodes is equal to the least significant digit determined with that comparison.

As stated above, for the illustrated embodiment, the increment is one volt during the first comparison and hence the least significant digit is one, or $2^{\circ}$. The most significant digit determined in the second comparison has the same significance and the weights of the three other digits are, respectively, $2^{-1}$, $2^{-2}$ and $2^{-3}$. Thus, the least significant digit $2^{-3}$, corresponds to ⅛ volt with the above parameters.

As noted above, the reference voltages used for the first comparison are preset into the system. The manner in which reference voltages are selected for succeeding comparisons is as follows. Following the first comparison the digital to analog converters 24 and 26 receive from the register 36 the first group of four binary digits. In response, the converter 26 applies to its terminal 26*a* a voltage corresponding to the result of the first comparison plus an offset of 1/16 volt, equal to one-half the increment for the second comparison. The converter 24 applies the same voltage plus 2 volts (twice the original increment) to its output terminal 24*a*. Thus, the new voltage increment between adjacent nodes 30 is 2/16 volts.

After the second comparison, the converters 24 and 26 receive, in addition to the first group of digits from the register 36, the second group of four digits from the register 40. In response, the converters 24 and 26 produce a third set of reference voltages for use in the third comparison to determine the value of the input voltage with still greater resolution.

FIG. 1 also includes a clock and distributor unit 48 that develops a succession of timing pulses and levels.

As indicated by the graphical representation of these timing signals in FIG. 1, the unit 48 develops, in succession, an initial pulse $P_0$, a level $D_1$, a pulse $P_1$, a level $D_2$, a pulse $P_2$ and a third level and pulse pair $D_3$ and $P_3$. The clock and distributor unit 48 is connected with the accumulator 38, the registers 36, 40 and 42 and the digital to analog converters 24 and 26 to control their operation as described below.

FIG. 2 is a detailed representation of the digital to analog converter 24; the converter 26 is identical. For the illustrated embodiment of my invention, the converter 24 is constructed with 11 similar stages 50*a*, 50*b* . . . 50*k*. The stage 50*a*, typical of the remaining stages, comprises a weighting resistor 54*a* connected from the converter output terminal 24*a* either to the base voltage source 46 through a gate 52*a* or to ground through a gate 56*a*.

More specifically, the gate 56*a* has an input terminal 74*a* and an output terminal 76*a* connected to a terminal 72*a*. The weighting resistor 54*a* is between the terminal 72*a* and the converter's output terminal 24*a*. A terminal 78*a* on the gate 56*a* is connected to ground, as shown. A small variable resistor (not shown) can be provided in series with the weighting resistor 54*a*, between terminals 24*a* and 72*a*, to trim the value of the weighting resistor to the value discussed hereinafter.

The input terminal 74*a* of the gate 56*a* and the input terminal 64*a* of an inverter 70*a* are connected together to a stage control terminal 62*a* to receive the same control signal. The output from the inverter is applied to an input terminal 58*a* of the gate 52*a*. The output terminal 60*a* of the gate 52*a* is connected through a variable resistor 61*a* to the terminal 72*a*. A terminal 66*a* of the gate 52*a* is connected to the base voltage source 46.

When a control signal corresponding to a binary ZERO is applied to the stage control terminal 62*a*, the gate 56*a* is enabled, and connects its output terminal 76*a* to its grounded terminal 78*a*. As a result, the terminal 72*a* is at ground potential. Simultaneously, the inverter 70*a* applies the inverted ZERO control signal to the input terminal 58*a* of gate 52*a*. This signal disables the gate 52*a*, thereby isolating its output terminal 60*a* from its terminal 66*a* and hence from the base voltage from source 46. In this condition, the stage 50*a* contributes nothing to the output voltage of the converter 24.

Conversely, when an assertion level control signal corresponding to a binary ONE is applied to the control terminal 62*a*, the gate 56*a* is disabled. The gate 52*a*, however, is enabled and clamps its output terminal 60*a* to the base voltage $V_B$. A fraction of a full scale voltage, depending on the resistance of resistor 54*a* as well as resistor 61*a*, then appears at the converter output terminal 24*a*. In the illustrated embodiment, the full scale voltage is 16, being one count larger than the largest input voltage the converter converts to digital notation. As discussed below, the full scale voltage is a function of the base voltage, being somewhat less than the base voltage.

In response to a control signal corresponding to a binary ONE, the inverter 70*a* drives the gate 52*a* with a signal that is larger than the input control signal. As a result, the resistance through the enabled gate 52*a* is less than the resistance through the gate 56*a* when the latter is enabled. Accordingly, a variable resistor 61*a* is provided in series with the gate 52*a* to equalize the resistances from terminal 72*a* through the gates when they are enabled.

The other stages 50, some of which are represented in block form, operate in the same manner as the stage 50*a*. However, in general, the weighting resistors 54 connected in them have different resistances from the resistor 54*a* and therefore the contributions to the potential at the terminal 24*a* from the different stages are different from that of the stage 50*a*. In other words, the resistors 54 together with the voltage divider 27 (FIG. 1) connected to the terminal 24*a* comprise a summing network that sums, at the terminal 24*a*, the voltages at the terminals 72 of the stages 50. These voltages, which are either ZERO (ground potential) or the base voltage of source 46, are given different weights in the different stages in the summation according to the resistances of the respective resistors 54.

As described above, including the internal converter resistances 24*b* and 26*b*, in the illustrated embodiment there are 16 (or $2^4$) resistances in the tapped voltage divider 27 of the comparing unit 20. As will become more apparent hereinafter, the voltage level representing each digit in the registers 36, 40 and 42 is applied to a digital to analog converter stage 50 that develops a fraction of the full-scale voltage equal to the weight of the digit reduced by the same factor of $2^4$. Thus, the first group of four digits that the encoder 34 delivers to the register 36, having the weights of $2^3$, $2^2$, $2^1$ and $2^0$, are applied to stages 50 that develop, respectively, a $2^{-1}$, a $2^{-2}$, a $2^{-3}$ and a $2^{-4}$ part of the full scale voltage.

The converter 24 converts an input number to the corresponding voltage by developing the voltage as a fraction, possibly greater than ONE, of the full scale voltage. The digits of the input number which are ONES determine the value of the resultant fraction. More specifically, each binary ONE in the digital number contributes to the converter 24 output voltage a fraction of the full scale voltage corresponding to the weight of the binary digit. Thus, when the most significant digit is a ONE, it contributes half, or a ($2^{-1}$) part, of the full scale voltage. A ONE in the second most significant digit position contributes a quarter, or a ($2^{-2}$) part, of the full scale voltage and when the third most significant digit is a ONE, it contributes a ($2^{-3}$) part of the full scale voltage to the converter's analog output voltage.

The converter 24 develops these fractions of the full scale voltage and sums them to develop the voltage at the terminal 24*a* in the following manner. The control terminal 62*a* of the stage 50*a* receives the voltage representing the most significant binary digit in the digital input to this converter and the combined value of its resistor 54*a* is R. For the illustrated embodiment of the invention, the full scale voltage is 16 volts. Accordingly, when the most significant digit of the binary number input to the converter is a ONE, the gate 52*a* is enabled and the gate 56*a* is disabled so that the stage 50*a* develops a ($2^{-1}$) part of the 16-volt full scale voltage, or 8 volts, at the terminal 24*a*.

The second stage 50*b* of the converter receives the second most significant digit of the binary number at its control terminal 62*b*. A ONE at this digit enables the second stage gate 52*b* to apply the base voltage to its resistor 54*b*, which has a value of 2R. The stage's gate 56*b* is disabled. Accordingly, the second stage 50*b* contributes a $2^{-2}$ part of the full scale voltage, or 4 volts, to the converter's output. Similarly, the stage 50*c* receives the third most significant digit to develop a $2^{-3}$ part of the full scale voltage, and, thus its resistor 54*c* has a value of 4R. The stages 50*d* and 50*e* each receive binary digits having the weight of $2^0$ to develop a $2^{-4}$ part of the full scale voltage. The series resistors in these stages have a resistance of 8R. The remaining stages 50*f*–50*k* of the converter 27 develop fractions of the full scale voltage equal, respectively, to $2^{-5}$, $2^{-6}$, $2^{-7}$, $2^{-7}$, $2^{-8}$, and $2^{-8}$, and their resistors 54*f*–54*k* have the resistance values shown in FIG. 2. Table 1 lists the open circuit output voltage each stage of the converter 24 contributes when assertion level (corresponding to a ONE) is applied to its control terminal 62 and the full scale voltage is 16 volts.

As shown in FIG. 1, the output of OR circuits 49 are connected to certain control terminals 62 of the digital to analog converters 24 and 26 to provide for reception of control signals from different sources.

For logical simplicity, reference to the digital to analog converters 24 and 26 will hereafter be made to their Thévenin equivalent circuits. As shown in FIG. 1, these equivalent circuits comprise adjustable batteries 24c and 26c in series with the resistances 24b and 26b, respectively. The battery voltage at the terminals 24a' and 26a' are the open circuit values of the voltages that the converters develop at their output terminals 24a and 26a.

TABLE 1.—CONTRIBUTION OF EACH DIGITAL TO ANALOG STAGE FOR A FULL SCALE VOLTAGE OF 16 VOLTS

| Stage | Weight | Contribution to Voltage at Terminal 24a' and 26a' ($2^N \times 16$ volts) |
|---|---|---|
| 50a | $2^{-1}$ | 8 |
| 50b | $2^{-2}$ | 4 |
| 50c | $2^{-3}$ | 2 |
| 50d | $2^{-4}$ | 1 |
| 50e | $2^{-4}$ | 1 |
| 50f | $2^{-5}$ | ½ |
| 50g | $2^{-6}$ | ¼ |
| 50h | $2^{-7}$ | ⅛ |
| 50i | $2^{-7}$ | ⅛ |
| 50j | $2^{-8}$ | 1/16 |
| 50k | $2^{-8}$ | 1/16 |

*Operation*

The detailed construction and operation of the analog to digital converter of the present invention will now be discussed with reference to an example in which an input of 4⅓ volts is to be converted to binary notation.

Referring again to FIG. 1, the clock and distributor unit 48 initiates an operative cycle of the system by delivering the first timing pulse $P_0$ to the accumulator 38 and the registers 36, 40 and 42. This pulse clears these logic circuits, setting all the bistable elements therein to the ZERO state.

The first comparison provides the four most significant digits of the desired binary number. In the illustrated embodiment where the full scale voltage is 16 volts, these digits have the weights $2^3$, $2^2$, $2^1$ and $2^0$. To develop these four digits, the increment between the reference voltages at adjacent nodes 30 is equal to the least significant digit, which has the weight $2^0$, and hence is one volt. Since there are sixteen resistors (14 resistors 28 plus the converter resistances 24b and 26b), it is desired that the digital to analog converters 24 and 26 develop a 16-volt difference between the converter terminals 24a' and 26a'.

Moreover, to aid in making corrections, during each comparison except the last, an offset equal to one-half the least significant digit for the comparison is added to the reference voltage at each node 30. This logic enables the converter to make all corrections in the form of an addition. The offset for the first comparison is accordingly one-half volt. To convert to binary notation the values of input voltages within the range from zero to sixteen volts, a one-half volt level is, accordingly, required at the terminal 26a' and a 16½ volt level at the terminal 24a'.

Following the pulse $P_0$, the clock and distributor unit 48 delivers the first timing level $D_1$ through an OR circuit 49a to the control terminal 62f of the digital to analog converter 26. The timing level thus enables the gate 52 in a stage in the converter having a weight of $2^{-5}$ and, as shown in Table 1, causes the converter 26 to develop a one-half volt level at its terminal 26a'.

Simultaneously, the clock and distributor unit 48 applies the level $D_1$, through OR circuits 49b, to the first four control terminals 62a–62d of the converter 24. This disables gate 56 and enables gate 52 in stages having weights of $2^{-1}$, $2^{-2}$, $2^{-3}$ and $2^{-4}$, and in response, the converter 24 output voltage is the sum of the contributions from these stages, to wit:

8 volts+4 volts+2 volts+1 volt or 15 volts

In addition, an inverter 68, shown in the lower left corner of FIG. 1, is connected to deliver, via OR circuits 49c, an assertion level to the control terminals 62e and 62f of the converter 24, thereby actuating stages having weights of $2^{-4}$ and $2^{-5}$ to apply the base voltage to their weighting resistors. Again referring to Table 1, these latter stages respectively contribute one volt and one-half volt to the converter 24 output voltage. Thus, for the first comparison, the first six stages 50a through 50f (FIG. 2) of the converter 24 are actuated to contribute to the output voltage, causing the converter to develop a 16½-volt level at its terminal 24a'.

In this manner, the converters 24 and 26 develop the desired ½ volt level at the terminal 26a' and the 16½-volt level at the terminal 24a', so that there is a 16-volt drop across the 16 equal-valued resistances, providing the one-volt increment between adjacent nodes 30. Table 2, summarizing the operation of the analog to digital converter for 4⅓ volt analog signal, lists the resultant reference voltage at each of the nodes 30a–30p.

With the above series of reference voltages and in response to the input 4⅓ volt signal, the comparators 32 connected to the anodes 30a, 30b and 30c are in the first condition, indicating that the input signal exceeds the reference voltages at these nodes. The remaining comparators 32 are in the second condition, since their reference voltages exceed the input signal. Accordingly, the 1, 2 and 3 inputs of the encoder 34 receive first-level signals and the remaining inputs receive second-level signals.

In response, the encoder 34 develops at its output terminals 34a the binary number 0011, corresponding to the decimal number 3 and indicating that the analog signal exceeds three reference voltages. Just prior to the end of the first timing level $D_1$, the clock and distributor 48 delivers the timing pulse $P_1$ to the register 36. This pulse enables the register 36 to store the four binary digits at the encoder terminals 34a and also transfer them to the accumulator 38. This completes the first comparison.

TABLE 2.—SUMMARY OF ANALOG TO DIGITAL CONVERTER OPERATION WITH 4⅓ VOLT INPUT

| Comparing Encoder | | First Comparison | | Second Comparison | | Third Comparison | |
|---|---|---|---|---|---|---|---|
| Unit Node | Input Terminal | Ref. Voltage | Encoder Output | Ref. Voltage | Encoder Output | Ref. Voltage | Encoder Output |
| 30p | 15 | 15½ | | 4 15/16 | | 4 31/64 | |
| 30n | 14 | 14½ | | 4 13/16 | | 4 30/64 | |
| 30m | 13 | 13½ | | 4 11/16 | | 4 29/64 | |
| 30l | 12 | 12½ | | 4 9/16 | | 4 28/64 | |
| 30k | 11 | 11½ | | 4 7/16 | | 4 27/64 | |
| 30j | 10 | 10½ | | 4 5/16 | 1010 | 4 26/64 | |
| 30i | 9 | 9½ | | 4 3/16 | | 4 25/64 | |
| 30h | 8 | 8½ | | 4 1/16 | | 4 24/64 | |
| 30g | 7 | 7½ | | 3 15/16 | | 4 23/64 | |
| 30f | 6 | 6½ | | 3 13/16 | | 4 22/64 | |
| 30e | 5 | 5½ | | 3 11/16 | | 4 21/64 | 0101 |
| 30d | 4 | 4½ | | 3 9/16 | | 4 20/64 | |
| 30c | 3 | 3½ | 0011 | 3 7/16 | | 4 19/64 | |
| 30b | 2 | 2½ | | 3 5/16 | | 4 18/64 | |
| 30a | 1 | 1½ | | 3 3/16 | | 4 17/64 | |

The digital to analog converters 24 and 26 receive the four digits from the register 36 and thus develop a new series of reference voltages for use in the next, second comparison. Specifically, each output from the register 36, connected to the accumulator 38, is also passed through a delay unit 70a, shown near the top in FIG. 1, to the correspondingly-weighted control terminals 62 of the digital to analog converters 24 and 26. Thus, the most significant digit determined with the first comparison, having a weight of $2^3$, is delivered through a delay unit 70a to the control terminal 62a of each converter 24 and 26. Similarly, the remaining three digits determined in the first comparison, having weights of $2^2$, $2^1$ and $2^0$, are delivered respectively to the converters' control terminals 62b, 62c and 62d.

In response, the digital to analog converters 24 and 26 develop an output voltage equal to the voltage identified by the four binary digits determined by the first comparison. This is three volts for the 4⅓ volt input used in this illustration.

An additional voltage equal to sixteen times the increment for the second comparison is added to the voltage at the terminal 24a. Since the second comparison determines the four binary digits having weights of $2^0$, $2^{-1}$, $2^{-2}$ and $2^{-3}$, the increment, equal to the least significant digit of the comparison, is $2^{-3}$ or $\frac{2}{16}$ volt. Accordingly, the additional voltage for the terminal 24a is $16\times(\frac{2}{16})=$ 2 volts.

A third component of the reference voltages for the second comparison is the offset, equal to one-half an increment, or $\frac{1}{16}$ volt.

The additional $2\frac{1}{16}$ volts at the terminal 24a are the result of the timing level $D_2$, which is applied to the terminals 62g–62j of the converter 24 and the nonoccurrence of the level $D_3$, which, with the inverter 68, causes the terminals 62e and 62f of this converter to be energized. Reference to Table 1 shows that ONE inputs at the terminals 62e–62j result in a total of $2\frac{1}{16}$ volts at the terminal 24a'.

The additional $\frac{1}{16}$ volt at the terminal 26a' results from the application of the level $D_2$ to the terminal 62j of the converter 26.

Hence, for the second comparison, the digital to analog converter 26 develops at the terminal 26a' a potential of $3\frac{1}{16}$ volts and the converter 24 develops at the terminal 24a a potential of $5\frac{1}{16}$ volts. These levels bracket the input level of 4⅓ volts and within a much smaller range than during the first comparison.

As seen in Table 2, the 4⅓ volt input signal now exceeds the reference voltages at the ten nodes 30a through 30j, causing the comparators 32 connected with these nodes to deliver first level signals to the first 10 inputs of the encoder 34. The remaining comparators 32 are in the second state and deliver second level signals to the encoder input terminals 11 through 15. Accordingly, the encoder develops the binary number 1010, corresponding to the decimal number 10. Immediately prior to termination of the second timing level $D_2$, the clock and distributor unit 48 delivers a timing pulse $P_2$ to the register 40. In response, the register stores the binary number 1010 from the encoder. The register 40 also transfers these digits to the accumulator 38.

The clock and distributor unit 48 then initiates the third comparison cycle by delivering the timing level $D_3$ to the digital to analog comparison converter 24. In addition, both digital to analog converters 24 and 26 receive, via delay units 70a and 70b, the four digits stored in the register 36 and the four additional digits, having the weights of $2^0$, $2^{-1}$, $2^{-2}$, and $2^{-3}$, now stored in the register 40. The converter 26 accordingly receives a binary ONE at its control terminals 62c, 62d, 62e and 62g. Reference to Table 1 indicates that the resulting voltage at each of terminals 24a' and 26a' is the sum of 2 volts, 1 volt, 1 volt and ¼ volt, or 4¼ volts.

The converter 24, receiving the level $D_3$ at its terminals 62i–62k, develops an additional ¼ volt at the terminal 24a' for a total of 4½ volts at this terminal. It will be noted that with the level $D_3$ there is no output from the inverter 68 at the terminals 62e and 62f of the converter 24.

No offset voltages are developed for the third comparison, since it is the last comparison in the illustrated system. Table 2 lists the new reference voltages at the nodes 30 of the comparing unit 20.

The comparators 32 whose outputs are connected to the encoder inputs 1, 2, 3, 4 and 5, now receive reference voltages less than the 4⅓ volt input signal and hence deliver first level signals to the encoder 34. The remaining encoder inputs 6–15 receive second level signals. Accordingly, the encoder develops at its input terminals 34a the binary number 0101, corresponding to the decimal number five.

Immediately prior to the end of the timing level $D_3$, the clock and distributor unit 48 delivers the timing pulse $P_3$ to the register 42, enabling it to store the binary digits the encoder develops at the terminals 34a. The register also transfers these digits to the accumulator 38.

The information now contained in the accumulator is set forth in Table 3, which lists the binary digits developed during the first, second and third comparisons. The accumulator sums these three groups of binary digits, adding together the same-significance digits determined in successive comparisons, to develop an output binary number of 0100.010101. This binary output number in the accumulator corresponds to the decimal number 4.328125, and differs from the 4⅓ input voltage by only 0.005208 volt, within the resolution of the system. In the event that greater accuracy is required, additional comparisons may be made in the manner described above.

It will now be seen that to effect the error-correction with simple logic equipment, for each comparison except the final one, the reference voltages are increased by an offset equal to one-half the least significant digit, i.e. one-half the increment for the particular comparison. As a result, in each comparison except the final one, the encoder develops a set of digits identifying a quantity equal to the input voltage reduced by one-half the least significant digit for the comparison. When this offset causes the input voltage not to exceed a reference voltage that it would otherwise exceed, the encoder produces a set of digits that is at least one count under the actual value of the input voltage. However, during the next comparison, when the converter redetermines the last digit of the preceding set, the additional count is picked up, so that when the two resultant series of digits are added, the resultant number accurately identifies the input voltage.

Referring again to Table 2, if the ½ volt offset were not added to the reference voltages for the first comparison, the 4⅓ volt input voltage would exceed the reference voltage at the fourth node 30d, increasing the encoder output by one count to 0100 for the four most significant digits. However, as illustrated in Table 3, the logic described above achieves the same result by adding the sets of digits from the initial and second comparisons. That is, the ONE in the most significant digit-position in the set of digits determined with the second comparison adds to the first set of digits, as set forth in Table 3.

Use of the self-correction logic decreases the settling time for all but the last comparison and increases the converter's ability to following a changing input voltage. More specifically, the self-correction eliminates possible errors that may result when the input voltage is respectively just below or just above a reference voltage and the comparator connected to the associated node erroneously fails to switch to its first state or erroneously switches. The position of the point in the output binary number from the accumulator is determined by the value of the full scale voltage.

TABLE 3.—ACCUMULATOR OPERATION WITH 4⅓ VOLT INPUT

| Weight | $2^{-1}$ | $2^{-2}$ | $2^{-3}$ | $2^{-4}$ | $2^{-5}$ | $2^{-6}$ | $2^{-7}$ | $2^{-8}$ | $2^{-9}$ | $2^{-10}$ |
|---|---|---|---|---|---|---|---|---|---|---|
| First Comparison | 0 | 0 | 1 | 1 | | | | | | |
| Second Comparison | | | | 1. | 0 | 1 | 0 | | | |
| Third Comparison | | | | | | | 0 | 1 | 0 | 1 |
| Accumulator Output | 0 | 1 | 0 | 0. | 0 | 1 | 0 | 1 | 0 | 1 |

*Time and accuracy considerations*

Each time the digital to analog converters 24 and 26 receive new inputs they require a finite time to develop the corresponding outputs at the terminals 24*a'* and 24*b'*. Additional time is required for the voltages at the nodes 30 to settle to their quiescent values. Moreover, the comparators 32 and the logic elements in the encoder 34, require finite times to respond to their input signals and complete their switching operations. Accordingly, the clock and distributor unit 48 applies each timing level $D_1$, $D_2$ and $D_3$ for a sufficient time so that the system has settled to the point where further changes do not effect the least significant digit determined with the comparison being performed. Hence, the duration of the timing levels $D_1$, $D_2$ and $D_3$ may increase for successive comparisons according to the settling time required for each comparison to be accurate to within its least significant digit. It should be noted that when the comparisons are automatically corrected as described above, for each comparison except the final one, the reference voltages have to settle only to within one-half the least significant digit for that comparison. The clock and distributor unit 48 delivers the timing pulses $P_1$, $P_2$ and $P_3$ to the registers 36, 40 and 42, respectively, only after the required settling time for the respective comparisons have elapsed.

The delay units 70*a* and 70*b*, connected between the registers 36 and 40 and the digital to analog converters 24 and 26 prevent the outputs of the registers from changing the conditions of the digital to analog converters 24 and 26 before all the digits from the encoder 24 are transferred to the registers 40. For example, assume that following the application of the timing pulse $P_1$ to the register 36, a logic element therein operates extremely fast and transfers a digit from the encoder output terminals 34*a* to the corresponding output of the register 36. In the absence of the delay unit 70*a*, it is possible that this rapidly transferred digit might appear in the input to the digital to analog converters 24 and 26 before the last digit from the encoder terminals 34*a* is transferred to the register 36. This would change the reference voltages in the comparing unit 20 before the results of the first comparison are fully transferred to the register 36, producing an error. The delay units 70*a* and 70*b* obviate this potential error by delaying application of the digits output from the registers 36 and 40 to the digital to analog converters 24 and 26 until completion of the comparison being performed.

As discussed above, a conventional parallel analog to digital converter completes the conversion in a time T and a convention successive converter requires a time NT, where N is the number of digits in the output binary number and T is the time per comparison step. With the analog to digital converter described herein, the total conversion time is NT/M where M is the average number of new digits determined by a single step, in the present example M is 10/3. It will be seen that this is a substantially shorter time than that required with a conventional successive converter. At the same time, the present converter requires considerably less equipment than a conventional parallel converter.

In the conversion of a varying input voltage to digital notation, one cannot be certain as to the exact time at which the voltage of the input signal is at the value indicated by a given reading from the converter. At best, one can determine that the digital output corresponds to a value that the input signal had at some time within a specified interval. This interval is termed the aperture time. For the present invention, the aperture time is equal to the time T required for each comparison step.

More specifically, the output number from an analog to digital converter indicates that the input signal had an amplitude $V \pm v$ volts at the time $T \pm t$. The time interval $2t$ is referred to as the aperture time.

The aperture time of an analog to digital converter depends both on the time required to perform the conversion and on the conversion method. For example, in the successive approximation converter described hereinabove, the aperture time is essentially equal to the total conversion time, since each conversion step is irrevocable. The most significant digit, for example, cannot be changed once it is decided upon. Thus, if the input voltage changes from the upper half of the selected range to the lower half after the first step of the conversion, the output will still indicate that the amplitude of the input voltage lies in the upper half of the selected region. On the other hand, with a counter type converter, also described above, using the same type of circuit as the successive approximation converter, the total conversion time will be longer but the aperture time will be equal to the time required for only the last step. This is because the counter converter stops converting when the input signal is equal to the converter output.

In the converter provided by the present invention, the aperture time is very short, particularly for input signals whose rate of change is less than a maximum value as discussed below. The rate of change of most signals used in data processing systems is less than this maximum value.

Consider again the conversion process according to the invention. During the first conversion step, with a full scale voltage of 16 volts, the input signal is divided into one-volt increments. The output is a number V with an uncertainty of ($\pm\frac{1}{2}$ volt$\pm v$).

The term "$\pm\frac{1}{2}$" volt results from quantizing the input voltage into one-volt increments. The term "$\pm v$" depends on how far circuits settle before the output from the comparing unit 20 (FIG. 1) is transferred to the registers 36, 40 and 42. Assume that this term "$v$" is $\frac{1}{4}$ volt. The output from the first conversion step is then between $V+\frac{3}{4}$ volt, $(V+\frac{1}{2}+\frac{1}{4})$, and $V-\frac{3}{4}$ volt.

During the second conversion step, the reference voltages extend from $(V-1)$ volt to $(V+1)$ volt. This range of reference voltages exceeds the known range of $(V\pm\frac{3}{4})$ volt by $\frac{1}{4}$ volt in either direction. Accordingly, when the change of input voltage does not exceed $\frac{1}{4}$ volt during the time for the first comparison step, the converter will be able to catch up with the input voltage during the second step. Thus, the aperture time for the converter of the present invention is reduced at least to the time required for the last two of the three steps.

The output from the second comparison step has an uncertainty, due to quantization, of $\pm\frac{1}{16}$ volt, plus an additional uncertainty due to unsettled transient voltages of $\pm v'$ volts. In the present example, where the range of reference voltages for the second comparison step is $\frac{1}{8}$ the range for the first step, $v'$ is $\frac{1}{8}$ of $v$, or is $\frac{1}{32}$ volt.

With $v'$ thus equal to $\frac{1}{32}$ volt the range of reference voltages developed for use during the third comparison step will exceed the range within which the input voltage is now known by ±1/32 volt. Thus, if the rate of change of the input signal does not exceed 1/32 volt during the time required for the second comparison step, the aperture time is reduced to the time required for the last comparison step. This is a fairly brief time and most signals will meet this requirement.

Achieving an aperture time equal to the conversion time for the last conversion step depends on $v$ and $v'$. When the settling time per conversion step is decreased so that the converter can operate in less time, the uncertainty terms $v$ and $v'$ increase. Therefore, the maximum rate of change of the input voltage that can be corrected for during the last conversion step, and hence the maximum rate of input voltage change for an aperture time equal to a single conversion step, is reduced. Conversely, when the settling time per step is increased, the maximum rate of input voltage change that can be accommodated in an aperture time equal to one conversion step increases. In the limiting case, the aperture time of the converter of the present invention is equal to the conversion time required for the last step. The aperture time of a conventional successive approximation converter having the same ten-bit capacity is 10 times the time per step for the successive approximation converter.

Thus, when the times per conversion step are equal for the two converters, the aperture time of the present converter is 1/10 the aperture time for the prior successive approximation converter. Similarly, the maximum rate of input voltage that can be "followed" is 10 times faster with the present system. Moreover, when all the converter steps take the same time, its total conversion time is only 3/10 as long as that required for the successive approximation system, since the present converter requires only three steps. In practice, the time per step need not be the same with either the prior successive approximation or the present conversion system, but the system of the present invention generally has a correspondingly shorter time than the successive approximation system.

Comparing the present conversion system with the prior counter converter and assuming equal step times, the aperture time is the same in both cases. However, the total conversion time for the present system is 3/1024 times the maximum time required for the counter converter and is 3/512 times the average time required for the counter converter.

It can also be shown that the maximum error correction of the present analog to digital converter is $\pm(M-1)$ binary digits where M is the average number of new digits determined by a single comparison. The maximum rate of change of the input voltage that the converter can follow is thereby increased by a factor of N as compared to the frequency the converter can follow when not equipped with the self-correction described above. As a result, when the input signal is changing by less than one least significant digit between comparisons, the converter follows the change with full accuracy; for the system described above, this accuracy is $2^{-10}$ or one part in 1024. When the analog signal is changing at a faster rate, the converter cannot continuously follow the input voltage to the full number of N digits. However, it is capable of recording peaks in the input voltage that would otherwise be lost. It will be noted that this feature of the converter is achieved without increasing the number of comparison steps.

*Encoder*

In the conventional binary number system, there are instances where more than one digit changes in going from one number to the next. For example, in going from 0111 (decimal 7), to 1000 (decimal 8) all the binary digits change.

As discussed above, it is possible that the comparing unit 20 is still settling at the time when the timing pulses, particularly the pulses $P_1$ and $P_2$, enable the registers to transfer the binary digits from the encoder output terminals to the registers. When the encoder 34 develops the binary digits at its output terminals according to the conventional binary notation, this settling can result in a substantial error.

For example, assume that a comparator 32 is in the process of switching from one condition to the other at the instant that the clock and distributor unit 48 develops a timing pulse; assume further that the change in the state of that comparator will change more than one binary digit in the output of the encoder 34. It is then possible that one of these digits will be changed and one will not be changed when the digits are transferred to a register, such as the register 36. If this occurs, the group of digits transferred to the register will be totally in error.

On the other hand, when the encoder 34 develops the binary numbers according to the Gray or inverted binary code, such an error cannot be greater than the least significant digit and thus it will be corrected by the error correction technique described above. This is because in the Gray code only one digit changes in going from one count to the next. Thus, switching a comparator 32 will change only one digit in the output from the encoder. Accordingly, the encoder 34 is preferably constructed according to conventional techniques to provide a Gray code number identifying the number of reference voltages that the analog voltage exceeds during each comparison. Gray to binary converters are then included in the registers 36, 40 and 42 to provide conventional binary notation to the accumulator 38 and to the inputs of the digital to analog converters 24 and 26.

*Summary*

In summary, described above is a novel method and apparatus for producing a digital number equal to the value of an input voltage by means of successive parallel comparisons. The converter uses the result from each comparison to determine the range of voltages covered by a new, higher-resolution series of reference voltages it automatically produces for use in the next comparison.

A converter embodying the novel conversion sequence requires only $2^{M-1}$ comparing elements and completes each conversion in the short time NT/M where T is the time per comparison and N is the total number of digits in the output number.

To operate the converter without making corrections, the reference voltage offset of one-half the increment is eliminated and the comparison cycles do not redetermine the last digit previously determined. The reference voltage increment for each comparison corresponds to the least significant digit to be determined with the comparison.

In the event that the analog to digital converter of the invention is to convert a negative input voltage to digital notation, the base voltage source 46, FIG. 1, develops a negative base voltage and the output voltage from the digital to analog converter 24 is more negative than the output voltage from the converter 24. The comparing unit 20 again develops a set of digits identifying the number of reference voltages that are less than the input voltage, or in other words, identifying the most extreme reference voltage that the analog voltage exceeds in the negative direction.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Having described the invention, what is claimed as new and secured by Lettered Patent is:

1. Data processing apparatus for converting an input voltage to a corresponding digital representation by means of successive comparisons, said apparatus comprising, in combination (A) comparing means comparing said input voltage with a series of reference voltages, (B) coding means connected to said comparing means and developing a set of digits identifying the most extreme reference voltage that said input voltage exceeds in a first direction, (C) program means developing control signals, (D) voltage producing means receiving said control signals and said set of digits and in response thereto developing, for the next successive comparison, a new series of reference voltages (1) having an increment between successive voltages that corresponds to the resolution of the next comparison, and (2) extending over a range including the voltage between the reference voltage identified during the preceding comparison and the next reference voltage in said first direction, (3) said voltage producing means developing each reference voltage in said new series thereof in response to said set of digits developed in the last preceding comparison, and (E) output means developing said digital representation in response to the sets of digits said coding means develops from said comparisons.

2. Apparatus according to claim 1 in which (A) said voltage producing means is arranged to develop for a second comparison a set of reference voltages with such an increment that said coding means develops the most significant digit in the set of digits determined with said second comparison with the same weight as the least significant digit in the set thereof determined with the comparison last preceding said second comparison, and (B) said output means is arranged to additively combine digits having the same significance in the sets thereof determined with said second comparison and the comparison last preceding it.

3. The apparatus defined in claim 1 in which (A) said voltage producing means is arranged to develop an extreme reference voltage in at least one series thereof with a value differing in the direction opposite to said first direction from said most extreme reference voltage identified in the last preceding comparison by (1) one-half the increment for the last preceding comparison (2) reduced by one and one-half times the increment for the next subsequent comparison.

4. Apparatus according to claim 1 in which (A) said voltage producing means is arranged to develop an extreme reference voltage in each series thereof, except for the final comparison, with a value differing in the direction opposite to said first direction from said most extreme reference voltage identified in the last preceding comparison by (1) one-half the increment for the last preceding comparison (2) reduced by one and one-half times the increment for the next comparison, (B) said program means is arranged to operate said voltage producing means to develop each new series of reference voltages with an increment equal to $(r^{n-(m-1)})$ where $r$ equals the radix of said digits in said sets thereof;

$n$ is the weight in the digital number system of radix ($r$) of the least significant digit determined with the last preceding comparison; and $m$ is the number of digits in each set thereof determined with each series of reference voltages, and (C) said output means develops said digital representation in response to an additive combination of said sets of digits.

5. Data processing apparatus for converting an input voltage to a corresponding digital representation by means of successive comparisons, said apparatus comprising, in combination (A) comparing means comparing said input voltage with a series of reference voltages, (B) coding means connected to said comparing means and developing a set of digits identifying the most extreme reference voltage that said input voltage exceeds in a first direction, (C) program means developing control signals, (D) a voltage divider having taps at which said reference voltages are developed, (E) digital to analog converter means (1) connected with said voltage divider, (2) having a plurality of input terminals connected in circuit with said coding means and with said program means, (3) receiving the digits in said previously determined sets thereof at said input terminals according to the weights of said digits and receiving selected control signals, and (4) developing across said voltage divider a voltage determined by said signals from said coding means and said program means to produce for the next successive comparison a new series of reference voltages at said voltage divider taps, (5) developing said voltage across said voltage divider such that said new series of reference voltages (a) has in increment between successive voltages that corresponds to the resolution of the next comparison, and (b) extends a range including the voltage between the reference voltage identified during the preceding comparison and the next reference voltage in said first direction.

6. The combination defined in claim 5 in which (A) said digital to analog converter means is arranged to develop for a second comparison next following a first comparison (1) a first voltage at one end of said voltage divider corresponding to said most extreme reference voltage identified in said first comparison offset in said first direction by one-half the increment for said second comparison and (2) a second voltage at the other end of said voltage divider equal to said first voltage plus twice the increment for said first comparison, and (B) said output means additively combines the digits from said coding means having the same weight.

7. Data processing apparatus for converting an input voltage to a corresponding digital representation by means of a succession of parallel comparisons in which said input voltage is simultaneously compared with an ordered series of reference voltages, said apparatus comprising, in combination, (A) a plurality of comparators, each comparator being connected to compare said input voltage with a different reference voltage in an ordered series thereof, (B) program means developing control signals for initiating each comparison between said input voltage and a series of said reference voltages, (C) coding means connected with said comparators and developing, for each comparison, a digital signal corresponding to the number of reference voltages that are smaller than said input voltage, (D) voltage producing means (1) connected to receive said control signals and said digital signals determined in preceding comparisons, and (2) developing in response thereto a new series of reference voltages for the next comparison, (3) said voltage producing means (a) developing each series of reference voltages with an increment between successive reference voltages no greater than the least significant digit of the digital signal to be developed with the next comparison, (b) developing, for the initial comparison, the smallest reference voltage equal to the smallest input voltage to be converted to digital notation plus 1.5 increments, and (c) developing the smallest reference voltage for the next, second, comparison with a value less than the largest reference voltage that said analog voltage exceeded in said first comparison by a voltage of (i) one-half the increment in the just comparison (ii) minus one and one-half times the increment for the next comparison, (iii) whereby the most significant digit in said digital signal from said coding means as a result of said second comparison has the same weight as the least significant digit developed in said first comparison, and (E) output means (1) connected with said coding means to receive said digital signals developed with said comparisons, and (2) developing said digital representation by summing said digital signals determined in said first and second comparisons, thereby correcting errors in the least significant digit of the digital signals determined in said first comparison.

8. The apparatus defined in claim 7 in which (A) said coding means develops said digital signals according to a digital numbering system having a selected base or radix, $r$, and (B) said voltage producing means comprises first and second digital to analog converters connected to opposite ends of a voltage divider, (1) each digital to analog converter having a plurality of stages, each stage developing when energized, a voltage equal to $r^x$ ($V_{max}$) where $x$ is an integer and $V_{max}$ is one count larger than the largest voltage said data processing apparatus can convert to digital notation, (2) each digit that said coding means develops being applied to energize a stage in each digital to analog converter which is associated with an integer $x$ that corresponds to the weight of the digit.

9. An analog to binary converter that performs a succession of parallel comparisons for each conversion, said converter comprising in combination (A) a voltage divider having a plurality of $w$ nodes and developing at said nodes a series of reference voltages with a uniform voltage increment between the voltages at adjacent nodes;

(B) a plurality of $w$ comparators, each comparator having first and second input terminals, (1) said first input terminals of said comparators being connected to said nodes and said second input terminals being connected to receive an input voltage corresponding to an analog quantity;

(C) an encoder having a plurality of $w$ input terminals at which it receives the output signal from each comparator and developing a binary number equal to the number of nodes having reference voltages that are less than said input voltage;

(D) output means connected with said encoder to receive said binary number from each comparison at different terminals according to the weights of the binary digits in said numbers, (1) said output means summing said binary numbers to develop an output number identifying the value of said input voltage;

(E) first and second digital to analog converters, each of which is connected to develop a voltage at an end of said voltage divider, (1) each digital to analog converter comprising a plurality of stages, each of which when energized contributes to the digital to analog converter output a binary fractional part of a voltage, $V_{max}$, one count greater than the largest voltage said analog to digital converter can convert to binary notation, (2) each digital to analog converter receiving from said output means the binary numbers determined in all preceding comparisons and applying each digit thereof to a stage associated with a binary fraction that corresponds to the weight of the digit, (3) said digital to analog converters developing each series of reference voltages with an increment I equal to the increment of the last preceding comparison divided by $[(w+1)/(2)]$; and (F) control means connected with said digital to analog converters to energize different stages therein for each comparison, (1) said control means energizing, for each comparison except the final one, stages in said first digital to analog converter to produce a voltage at a first node equal to the largest reference voltage said input voltage exceeded in the last preceding comparison less one-half the increment for the last preceding comparison and plus one and one-half times the increment I′ for the next comparison, and (2) energizing stages in said second digital to analog converter to produce at the last node a voltage $(w-1)I'$ volts greater than said voltage at the first node, (a) so that the most significant digit in each of said binary numbers developed in said encoder has the same weight as the least significant digit determined in the last preceding comparison.

10. In an analog to digital converter in which an input voltage is successively compared with different reference voltages to determine with each comparison successively less significant digits of the digital representation of said input voltage, apparatus for correcting the least significant digit determined with a first comparison immediately preceding a second comparison, said apparatus comprising (A) means comparing said input voltage with said reference voltages and determining, in said second comparison, successively less significant digits of said digital representation than determined in said first comparison;

(B) reference voltage means receiving signals corresponding to said digits determined in said first comparison and developing said reference voltages for said second comparison in response to said signals and offset from the result of said first comparison by one-half the least significant digit to be determined with said second comparison, (1) so that said comparing means redetermines for said second comparison the least significant digit determined with said first comparison; and (C) output means (1) receiving the digits determined with said first and second comparisons and (2) adding equal-weight digits determined in said first and second comparisons to develop said digital representation.

11. The combination defined in claim 10 further comprising (A) program means (1) producing timing signals for scheduling the performance of each of said first and second comparisons between said input voltage and said reference voltages, (2) producing said timing signals in such a timed sequence that said input voltage is compared with reference voltages that have settled during each of said first and second comparisons to within one-half the least significant digit determined with that comparison.

12. Apparatus for converting an input voltage to a corresponding digital representation, said apparatus comprising (A) first means (1) comparing said input voltage with a series of reference voltages, and (2) producing a set of digits identifying the first reference voltage said input voltage exceeds in a first direction, (B) second means (1) receiving signals corresponding to the digits determined in a first comparing step, and (2) developing in response to said signals a new series of reference voltages for a second comparison next following after said first comparison, said second means developing said new series of reference voltages (a) with an increment $I_2$ equal to $(r^{n-(m-1)})$ where $r$ equals the radix of said digits determined with said first means;

$n$ is the weight in the digital number system of radix $r$ of the least significant digit determined with said first comparison; and $m$ is the number of digits to be determined in said second comparison, and (b) with the smallest reference voltage in said first direction having a value equal to $V_1-(\frac{1}{2}I_1-1\frac{1}{2}I_2)$ where $V_1$ is the value of said first reference voltage identified in said first comparison; and $I_1$ is the increment between successive reference voltages of said first comparison, and (C) means accumulating the sets of digits determined in each comparison to develop said digital representation.

References Cited by the Examiner

UNITED STATES PATENTS

| | | | |
|---|---|---|---|
| 2,896,198 | 7/1959 | Bennett | 340—347 |
| 3,072,846 | 1/1963 | Belcher | 324—99 |
| 3,100,298 | 8/1963 | Fluhr | 340—347 |

DARYL W. COOK, *Acting Primary Examiner.*

W. J. ATKINS, A. L. NEWMAN, *Assistant Examiners.*